(12) United States Patent
Rapoport et al.

(10) Patent No.: US 9,551,731 B2
(45) Date of Patent: Jan. 24, 2017

(54) GANTRY FOR MOBILIZING AN MRI DEVICE TOWARDS STATIC PATIENTS

(71) Applicant: Aspect Imaging Ltd., Shoham (IL)

(72) Inventors: Uri Rapoport, Moshav Ben Shemen (IL); Eran Toledo, Tel Aviv (IL); Thomas Rangi Sutton, Milan (IT); Itzchak Rabinoviz, Nes Tsiyona (IL)

(73) Assignee: Aspect Imaging Ltd., Shoham (IL)

( * ) Notice: Subject to any disclaimer, the term of this patent is extended or adjusted under 35 U.S.C. 154(b) by 497 days.

(21) Appl. No.: 14/093,961

(22) Filed: Dec. 2, 2013

(65) Prior Publication Data

US 2014/0152302 A1    Jun. 5, 2014

Related U.S. Application Data

(63) Continuation-in-part of application No. 13/939,343, filed on Jul. 11, 2013.
(Continued)

(51) Int. Cl.
*G01V 3/00* (2006.01)
*G01R 3/00* (2006.01)
(Continued)

(52) U.S. Cl.
CPC .............. *G01R 3/00* (2013.01); *G01R 33/3802* (2013.01); *G01R 33/3808* (2013.01); *G01R 33/307* (2013.01); *Y10T 29/49002* (2015.01)

(58) Field of Classification Search
USPC ....................................................... 324/307
See application file for complete search history.

(56) References Cited

U.S. PATENT DOCUMENTS 4,543,959 A * 10/1985 Sepponen .............. A61B 5/055
324/309
4,875,485 A * 10/1989 Matsutani .............. G01R 33/28
324/307
(Continued)

FOREIGN PATENT DOCUMENTS

DE      102008009673     *  8/2009
DE      102008009673 A1    8/2009
(Continued)

OTHER PUBLICATIONS

Rapoport, Uri, "RF Shielding Conduit in an MRI Closure Assembly", co-pending U.S. Appl. No. 14/574,785, filed Dec. 18, 2014.
(Continued)

*Primary Examiner* — Rodney Fuller
(74) *Attorney, Agent, or Firm* — Pearl Cohen Zedek Latzer Baratz LLP

(57) ABSTRACT

The present invention discloses methods, gantry, and room's infrastructure for maneuvering a portable open-bore magnetic resonance device with no fringing of its magnetic field (MRD) from at least one first location towards at least one static patient placed at at least one second remote location. The gantry comprises a transporting mechanism; and, an open-bore MRD, interconnected to the gantry by at least one maneuverable member. The MRD, by means of the gantry, is transportable from the first location to the second remote location adjacent the static patient. The aperture of the MRD's open-bore, by means of said maneuverable member, is directable towards a defined spatially orientation facing the static patient.

7 Claims, 9 Drawing Sheets

Related U.S. Application Data

(60) Provisional application No. 61/732,353, filed on Dec. 2, 2012.

(51) Int. Cl.
  *G01R 33/38* (2006.01)
  *G01R 33/30* (2006.01)

(56) References Cited

U.S. PATENT DOCUMENTS

| | | | |
|---|---|---|---|
| 4,968,961 A | 11/1990 | Miyajima et al. | |
| 5,153,546 A * | 10/1992 | Laskaris | G01R 33/3806 324/318 |
| 5,436,607 A * | 7/1995 | Chari | G01R 33/3806 324/318 |
| 6,128,522 A * | 10/2000 | Acker | A61B 5/055 335/298 |
| 6,157,278 A * | 12/2000 | Katznelson | G01R 33/3806 324/319 |
| 6,208,142 B1 * | 3/2001 | Wagshul | G01R 33/3808 324/309 |
| 6,278,274 B1 * | 8/2001 | Biglieri | G01R 33/3806 324/318 |
| 8,118,488 B2 | 2/2012 | Gregerson | |
| 8,555,578 B2 | 10/2013 | Hushek | |
| 8,807,084 B2 | 8/2014 | Rapoport et al. | |
| 8,851,018 B2 | 10/2014 | Rapoport et al. | |
| 8,896,310 B2 | 11/2014 | Rapoport | |
| 9,055,912 B2 | 6/2015 | Graumann et al. | |
| 2001/0038489 A1 * | 11/2001 | Nakamura | A61B 90/36 359/368 |
| 2002/0123681 A1 | 9/2002 | Zuk et al. | |
| 2007/0238950 A1 | 10/2007 | Vija et al. | |
| 2008/0021317 A1 * | 1/2008 | Sumanaweera | A61B 8/4218 600/437 |
| 2008/0103388 A1 * | 5/2008 | Maschke | A61B 6/4441 600/424 |
| 2008/0171931 A1 | 7/2008 | Maschke | |
| 2009/0213997 A1 | 8/2009 | Maschke | |
| 2010/0066368 A1 * | 3/2010 | Gao | G01R 33/307 324/318 |
| 2010/0145358 A1 * | 6/2010 | Maschke | A61B 17/3403 606/130 |
| 2011/0162652 A1 | 7/2011 | Rapoport | |
| 2011/0186049 A1 | 8/2011 | Rapoport | |
| 2011/0234347 A1 | 9/2011 | Rapoport | |
| 2011/0274238 A1 * | 11/2011 | Maschke | A61B 6/035 378/9 |
| 2011/0280364 A1 * | 11/2011 | Maschke | A61B 6/037 378/4 |
| 2011/0280380 A1 * | 11/2011 | Maschke | A61B 6/4411 378/196 |
| 2011/0282184 A1 * | 11/2011 | Klingenbeck | G01R 33/4812 600/411 |
| 2011/0304333 A1 | 12/2011 | Rapoport | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0119742 A1 | 5/2012 | Rapoport | |
| 2013/0079624 A1 | 3/2013 | Rapoport | |
| 2013/0109956 A1 | 5/2013 | Rapoport | |
| 2013/0237803 A1 | 9/2013 | Rapoport | |
| 2013/0328559 A1 | 12/2013 | Rapoport | |
| 2013/0328560 A1 | 12/2013 | Rapoport | |
| 2013/0328563 A1 | 12/2013 | Rapoport | |
| 2014/0050827 A1 | 2/2014 | Rapoport | |
| 2014/0051973 A1 | 2/2014 | Rapoport et al. | |
| 2014/0051974 A1 | 2/2014 | Rapoport et al. | |
| 2014/0051976 A1 | 2/2014 | Rapoport et al. | |
| 2014/0099010 A1 | 4/2014 | Rapoport et al. | |
| 2014/0103927 A1 | 4/2014 | Rapoport | |
| 2014/0117989 A1 | 5/2014 | Rapoport | |
| 2014/0128725 A1 | 5/2014 | Rapoport et al. | |
| 2014/0139216 A1 | 5/2014 | Rapoport | |
| 2014/0142914 A1 | 5/2014 | Rapoport | |
| 2014/0152302 A1 | 6/2014 | Rapoport et al. | |
| 2014/0152310 A1 | 6/2014 | Rapoport | |
| 2014/0158062 A1 | 6/2014 | Rapoport et al. | |
| 2014/0230850 A1 | 8/2014 | Rapoport | |
| 2014/0257081 A1 | 9/2014 | Rapoport | |
| 2014/0266203 A1 | 9/2014 | Rapoport et al. | |
| 2014/0300358 A1 | 10/2014 | Rapoport | |
| 2014/0378821 A1 | 12/2014 | Rapoport et al. | |
| 2014/0378825 A1 | 12/2014 | Rapoport et al. | |
| 2015/0005618 A1 * | 1/2015 | Dumoulin | A61B 5/0555 600/415 |
| 2015/0059655 A1 | 3/2015 | Rapoport | |
| 2015/0065788 A1 | 3/2015 | Rapoport | |
| 2015/0226817 A1 * | 8/2015 | Pourrahimi | G01R 33/3815 324/309 |
| 2015/0230766 A1 * | 8/2015 | Wang | A61B 6/4417 600/411 |

FOREIGN PATENT DOCUMENTS

| | | |
|---|---|---|
| DE | 102008009674 | 8/2009 |
| DE | 102008009674 A1 | 8/2009 |

OTHER PUBLICATIONS

Aspect Imaging Ltd., "System and Method for Generating Invasively Hyperpolarized Images", co-pending U.S. Appl. No. 14/556,682, filed Dec. 1, 2014.

Aspect Imaging Ltd., "System and Method for Generating Invasively Hyperpolarized Images", co-pending U.S. Appl. No. 14/556,654, filed Dec. 1, 2014.

Aspect Imaging Ltd., "MRI with Magnet Assembly Adapted for Convenient Scanning of Laboratory Animals with Automated RF Tuning Unit", co-pending U.S. Appl. No. 14/581,266, filed Dec. 23, 2014.

Aspect Imaging Ltd., "Foamed Patient Transport Incubator", co-pending U.S. Appl. No. 14/531,289, filed Nov. 3, 2014.

Aspect Imaging Ltd., "Mechanical Clutch for MRI", co-pending U.S. Appl. No. 14/611,379, filed Feb. 2, 2015.

Aspect Imaging Ltd., "Incubator Deployable Multi-Functional Panel", co-pending U.S. Appl. No. 14/619,557, filed Feb. 11, 2015.

Aspect Imaging Ltd., "MRI Thermo-Isolating Jacket", co-pending U.S. Appl. No. 14/623,039, filed Feb. 16, 2015.

Aspect Imaging Ltd., "MRI RF Shielding Jacket", co-pending U.S. Appl. No. 14/623,051, filed Feb. 16, 2015.

Aspect Imaging Ltd., "Capsule for a Pneumatic Sample Feedway", co-pending U.S. Appl. No. 14/626,391, filed Feb. 19, 2015.

Aspect Imaging Ltd., "Incubator's Canopy with Sensor Dependent Variably Transparent Walls and Methods for Dimming Lights Thereof", co-pending U.S. Appl. No. 14/453,909, filed Aug. 7, 2014.

Aspect Imaging Ltd., "Temperature-Controlled Exchangeable NMR Probe Cassette and Methods Thereof", co-pending U.S. Appl. No. 14/504,890, filed Oct. 2, 2014.

Aspect Imaging Ltd., "NMR Extractable Probe Cassette Means and Methods Thereof", co-pending U.S. Appl. No. 14/504,907, filed Oct. 2, 2014.

Aspect Imaging Ltd., "Means for Operating an MRI Device Within a RF-Magnetic Environment", co-pending U.S. Appl. No. 14/596,320, filed Jan. 14, 2015.

Aspect Imaging Ltd., "Means and Method for Operating an MRI Device Within a RF-Magnetic Environment", co-pending U.S. Appl. No. 14/596,329, filed Jan. 14, 2015.

Aspect Imaging Ltd., "CT/MRI Integrated System for the Diagnosis of Acute Strokes and Methods Thereof", co-pending U.S. Appl. No. 14/598,517, filed Jan. 16, 2015.

Aspect Imaging Ltd., "RF Automated Tuning System Used in a Magnetic Resonance Device and Methods Thereof", co-pending U.S. Appl. No. 14/588,741, filed Jan. 2, 2015.

Aspect Imaging Ltd., "A Method for Providing High Resolution, High Contrast Fused MRI Images", co-pending U.S. Appl. No. 13/877,553, filed Apr. 3, 2013.

(56) References Cited

OTHER PUBLICATIONS

Aspect Imaging Ltd., "A Method for Manipulating the MRI's Protocol of Pulse-Sequences", co-pending U.S. Appl. No. 14/070,695, filed Nov. 4, 2013.
Extended European Search Report issued by the European Patent Office dated Jun. 27, 2014 in corresponding European Application No. EP 13195292.1.
Aspect Imaging Ltd, "MRI-Incubator-3 s Closure Assembly", co-pending U.S. Appl. No. 14/539,442, filed Nov. 12, 2014.
Aspect Imaging Ltd., "Shutting Assembly for Closing an Entrance of an MRI Device", co-pending U.S. Appl. No. 14/540,163, filed Nov. 13, 2014.
Aspect Imaging Ltd., "Cage in an MRD with a Fastening/Attenuating System", co-pending U.S. Appl. No. 14/527,950, filed Oct. 30, 2014.
US office action for U.S. Appl. No. 13/939,343, dated Jan. 8, 2016.
Extended Europen Search Report for EP Application No. 13195292.1 dated Jun. 27, 2014.
US Final office action for U.S. Appl. No. 13/939,343, dated Jun. 15, 2016.

* cited by examiner

GANTRY FOR MOBILIZING AN MRI DEVICE TOWARDS STATIC PATIENTS

CROSS-REFERENCE TO RELATED APPLICATIONS

This application is continuation-in-part of U.S. patent application Ser. No. 13/939,343, filed Jul. 11, 2013, which claims the benefit of U.S. patent application Ser. No. 61/732,353, filed Dec. 2, 2012, all of which are incorporated herein by reference.

FIELD OF THE INVENTION

The present invention relates to the field of mobilizing an MRI device (MRD). More specifically, it relates to means and methods for approaching a maneuverable MRD towards a static patient to be imagined.

BACKGROUND OF THE INVENTION

MRI devices are of special importance in the world of medical imaging. Unlike other imaging methods, they present no radiation to the object of which they image. However, together with the benefit of no-radiation, comes the price of very large and complicated machine. In case of patients that are not able to move (e.g. premature baby in an incubator), the option of using an MRI device for scanning is practically impossible.

US patent application US2007/0238950 discloses a maneuverable medical device. However, the constructions of these modules depend on the location of a static patient pallet, and are oriented according to this static pallet location. In addition, the construction and medical device requires the entire room to be designated for the imaging.

U.S. Pat. No. 8,555,578 disclose a movable door element in a door of a multimodality medical suite, the door is part of a wall positioned between a first room and a second room of the suite, with the suite including a flexible raceway configured to extend within the length of the suite between the rooms and selectively extend through a portion of the door.

U.S. Pat. No. 8,118,488 discloses a medical imaging system, comprising: a base having a top surface, a first end and a second end; a pedestal connected to the base and positioned adjacent to the first end of the base, the pedestal extending in a vertical direction above the top surface of the base and configured to accept a plurality of interchangeable procedure-specific tabletop supports, and the pedestal is rotatable about an axis extending generally normal to the top surface of the base; and a gantry ring having a bore and an image collection apparatus, the gantry ring coupled to the base and positioned above the top surface of base, the gantry ring configured to translate along a length of the base between a first position adjacent to the pedestal to a second position adjacent to the second end of the base, the gantry ring further configured to rotate at least about ninety degrees with respect to an axis extending generally normal to the top surface. This device requires that the patient pallet will be located on the system. In addition the system is not and cannot be an integral part of a patient's room. The system needs to be delivered to patient's room, and therefore will occupy needed space. Therefore, the system does not support the needs of easily imaging a non-movable patient.

There is therefore a long unmet need for a system which is integrated to a patient room, and allows in situ and real time imaging of patients without moving them to remote MRI rooms.

SUMMARY OF THE INVENTION

An object of the invention is thus to disclose a gantry for maneuvering a portable open-bore magnetic resonance device with no fringing of its magnetic field (MRD) from at least one first location towards at least one static patient placed at least one second remote location. The gantry comprises a transporting mechanism and, an open-bore MRD, interconnected to the gantry by at least one maneuverable member. The MRD, by means of the gantry, is transportable from the first location to the second remote location adjacent the static patient. Additionally, the aperture of the MRD's open-bore, by means of the maneuverable member, is directable towards a defined spatial orientation facing the static patient. Hence, in situ and real time imaging of a static patient who cannot be transferred to MRD's remote location is possible.

It is another object of the invention to disclose the gantry as defined above, wherein an MRD maneuvering system (MMS) is provided for maneuvering an MRD from at least one first location to at least one second remote location, thereby imaging in situ and in real time a static patient which cannot be transferred to MRD's remote location is possible. The MMS comprises the gantry as defined above which comprises a transporting mechanism; and, an MRD, interconnected to the gantry by at least one maneuverable member. The MRD, by means of the gantry, is transportable from the first location to the second remote location adjacent the static patient. The aperture of the MRD's open-bore, by means of the maneuverable member, is directable towards a defined spatial orientation facing the static patient.

It is another object of the invention to disclose an MMS for maneuvering a neonate's-type MRD. The MMS comprises a gantry as defined in any of the above with a transporting mechanism; and, a neonate's-type MRD, interconnected to the gantry by at least one maneuverable member. The MRD, by means of the gantry, is transportable from a first location to a neonate at a second remote location where neonate's incubator is placed. The aperture of the MRD's open-bore, by means of the maneuverable member, is directable towards a defined spatial orientation facing the neonate or incubator thereof.

It is another object of the invention to disclose an MMS for maneuvering a wrist-type MRD, comprising: a gantry as defined above which comprises a transporting mechanism; and, a wrist-type MRD, interconnected to the gantry by at least one maneuverable member. The MRD, by means of the gantry, is transportable from a first location to a second remote location. The aperture of the MRD's open-bore, by means of the maneuverable member, is directable towards a defined spatial orientation facing the wrist of a patient.

It is another object of the invention to disclose the gantry as defined in any of the above, wherein the maneuverable member is selected from a group consisting of an articulated joint, a flexible joint, a rotatable joint, internally compensated self-aligning rotary joint, a ball joint, ball and socket joint, elbow constructed joint, hydraulic joint mechanism, telescopic joint, clampers, gimbals and claspers thereof and any combination thereof.

It is another object of the invention to disclose a method of maneuvering a portable open-bore magnetic resonance device with no fringing of its magnetic field (MRD) from at least one first location towards at least one static patient placed at least one second remote location by means of a gantry. The method comprises steps of (a) providing the gantry with a transporting mechanism; (b) interconnecting an open-bore MRD to the gantry by at least one maneuverable member; (c) transporting the MRD, by means of the gantry, from the first location to the second remote location adjacent the static patient; and (d) directing the aperture of the MRD's open-bore, by means of the maneuverable member, towards a defined spatial orientation facing the static patient.

It is another object of the invention to disclose a method of maneuvering a portable open-bore magnetic resonance device with no fringing of its magnetic field (MRD) from at least one first location towards at least one static patient placed at least one second remote location by means of an MRD maneuvering system (MMS). The method comprises steps of (a) providing the MMS within a room; (b) interconnecting the MMS to a gantry having inter alia a transporting mechanism; (c) interconnecting an open-bore MRD to the gantry by at least one maneuverable member; (d) transporting the MRD, by means of the gantry, from the first location to the second remote location adjacent the static patient; and (e) directing the aperture of the MRD's open-bore, by means of the maneuverable member, towards a defined spatial orientation facing the static patient.

It is another object of the invention to disclose a method of maneuvering a portable open-bore neonate's-type magnetic resonance device with no fringing of its magnetic field (neonate's-type MRD) from at least one first location towards at least one static neonate placed in an incubator at least one second remote location by means of a neonate's-type MRD maneuvering system (MMS). The method comprises steps of (a) providing the MMS with in a room; (b) interconnecting the MMS to a gantry having inter alia a transporting mechanism; (c) interconnecting an open-bore neonate's-type MRD to the gantry by at least one maneuverable member; (d) transporting the neonate's-type MRD, by means of the gantry, from the first location to the second remote location adjacent to a neonate or incubator thereof; and (e) directing the aperture of the neonate's-type MRD's open-bore, by means of the maneuverable member, towards a defined spatial orientation facing the neonate or an incubator thereof.

It is another object of the invention to disclose a method of maneuvering a portable open-bore wrist-type magnetic resonance device with no fringing of its magnetic field (wrist-type MRD) from at least one first location towards at least one static patient placed at least one second remote location by means of a wrist-type MRD maneuvering system (MMS). This method comprising steps of (a) providing the MMS with in a room; (b) interconnecting the MMS to a gantry having inter alia a transporting mechanism; (c) interconnecting an open-bore wrist-type MRD to the gantry by at least one maneuverable member; (d) transporting the wrist-type MRD, by means of the gantry, from the first location to the second remote location adjacent to the static patient and (e) directing the aperture of the wrist-type MRD's open-bore, by means of the maneuverable member, towards a defined spatial orientation facing the patient's wrist.

It is another object of the invention to disclose a method of mobilizing a maneuverable open-bore MRD from a first location to a second remote location to a static patient or organs thereof, characterized by the following steps: providing in a room at least one first location and at least one second remote location; constructing a structural surface in at least one portion of the room; temporarily or permanently interconnecting the gantry to the surface by means of a transporting mechanism; temporarily or permanently interconnecting the gantry to an MRD by means of at least one maneuverable member; transporting the MRD, by means of the transporting mechanism, from the at least one first location to the at least one second remote location; and at the at least one second location, spatially orienting the open-bore's aperture of the MRD, by means of the maneuverable member, towards the patients or organs thereof; thereby imaging the static patient or organ thereof by means of the maneuverable MRD.

BRIEF DESCRIPTION OF THE DRAWINGS

In order to understand the invention and to see how it may be implemented in practice, a few preferred embodiments will now be described, by way of non-limiting example only, with reference to be accompanying drawings, in which.

DETAILED DESCRIPTION OF THE INVENTION

Figure 1:
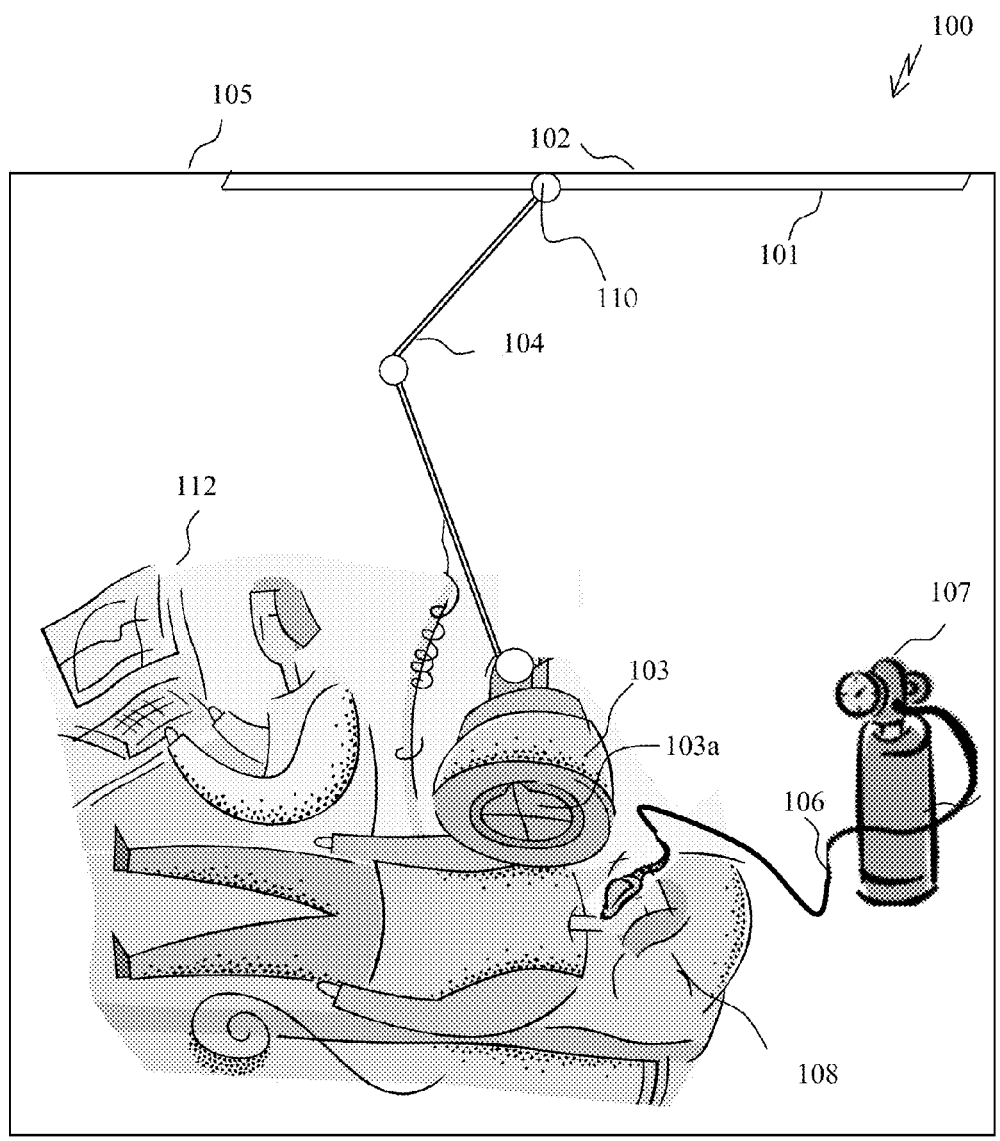
FIG. 1 shows one embodiment of the system for mobilizing an open-bore MRD (103) having an open bore's aperture (103a) constructed on the ceiling of a patient room.

The following description is provided so as to enable any person skilled in the art to make use of the invention and sets forth examples contemplated by the inventor of carrying out this invention. Various modifications, however, will remain apparent to those skilled in the art, since the generic principles of the present invention have been defined specifically. Also, it is to be understood that the phraseology and terminology employed herein is for the purpose of description and should not be regarded as limiting.

A maneuverable MRD system (MMS) for mobilizing an open-bore MRD, characterized by substantially no fringing magnetic fields, in a room towards a static (non-mobile) patient and directing the aperture of the open-bore MRD towards the patient is herein presented. The MMS comprises at least one gantry which is adapted to maneuver the MRD in N degrees of freedom; N is an integer greater than or equal 1.

The term "gantry" refers hereinafter to a crane, or set of cranes, together with a set of modules adapted to move and operate the cranes. The modules may be rails attached to any surface on which cranes are constructed upon. The term also refers hereinafter to a cart, lug, and a wheeled maneuverable construction, such as a forklift truck, forklift, hand pallet truck, such as pallet pump, pump truck, or jigger, walkie low lift truck, rider low lift truck, towing tractor, walkie stacker, rider stacker, reach truck, electric counterbalanced truck, side-loader, telescopic handler, walkie order picking truck, order picker flexi or bendi trucks, guided very narrow aisle truck, guided very narrow aisle order picking truck, truck mounted forklift/sod loader.

The term "maneuverable member" refers hereinafter to a pivoted member, gimbal, joint, articulate structure, rotation or bending constructions etc., which is connected to an object and allows a maneuver the object in one manner or in a multiple degrees of freedom.

The term "location" refers hereinafter to both location and orientation, least one first location to at least one second remote location The term "patient" refers to a static human patient, such as a neonate, mature patient or portions or organs thereof, such as head, wrist etc. The term further relates to a static animal and organs thereof and to static non-leaving object of any kind, to be analyzed by the moveable MRD.

The term 'static' refers hereinafter to a substantially non-moving, immobilized, static patient and organ thereof.

The term "MRD" refers hereinafter to portable open-bore magnetic resonance imaging device with have no fringing of its magnetic field. The term refers to an MRD which is constructed as a single unit, or a series of units which are not fixed in a certain location. The term also refers to portable and compact MRDs, such as a member of the 'M'-series, commercially available permanent-magnet open-bore MRI device by Aspect Imaging Ltd (US). The term further refers to any analyzing, imaging or scanning medical device, and particularly to nuclear magnetic resonance (NMR) spectroscope, computed tomography (CT), computed axial tomography (CAT), electron spin resonance (ESR) spectroscope, nuclear quadruple resonance (NQR) or to any combination thereof.

The term 'automatic' or 'automatically' refers to any process or action that proceeds without the necessity of direct action of a human being.

The term 'manual' or 'manually' refers to any process or action necessitating direct operation of a human being, either by physical work, or by operating a computerized system. For example, compact MRD may be maneuvered by pushing it by a medical crew or it can be moved by operating a machine which will move it.

The term "degrees of freedom" refers to the number of independent displacements and/or rotations that specify the orientation of the body or system.

The term "room" refers herein to a predefined room, hallway, space, area, volume, such as a hospital room, intensive care department etc. Moreover, the term room refers herein after to two or more rooms interconnected by a hallway; two or more intercommoned and/or intraconnected spaces etc., such as a hospital's floor (e.g., orthopedic story), a multi-rooms newborn intensive care unit etc.

Reference is now made to FIG. 1 illustrating in a non-limiting and in non-in-scale manners a system 100 for mobilizing an open bore MRD device 103 which comprises an aperture at the end of its bore. System 100 comprises at least one gantry 101 attached to at least one structural surface 102, illustrated as a ceiling; the ceiling is part of a patient's room 105; a compact maneuverable MRD 103 device interconnected to at least one gantry 101 such that the gantry 101 is adapted to move this MRD 103 in N degrees of freedom; N is an integer greater than or equals 1.

Still referring FIG. 1, an MRD maneuvering system (MMS) 100 is useful for mobilizing MRD 103 in a room 105. This MMS comprises, in a room (105) comprising a structural surface (102), a gantry (101) temporarily or permanently interconnected to the surface (or to the room's infrastructure) by a transporting mechanism (e.g., wheels); and an MRD (103) characterized by a non-fringing magnetic field, having open-bore's aperture (103a) in which patient or organ thereof is imagined, temporarily or permanently interconnected to the gantry by at least one joint (104). At least one second location adjacent to a static (non-moving) patient, the maneuverable MRD, by means of the gantry and/or the joint (e.g., 101 and/or 104), is adapted to be (i) positioned and (ii) spatially oriented in two or more different orientations; and wherein the gantry, by means of the transporting mechanism, is adapted to reciprocate the MRD from the at least one first location to at least one second remote location.

In some embodiments of the current invention, compact MRD 103 is interconnected to the at least one gantry 101 by a module 104 constructed of N joints (e.g., 1<N>4) as schematically illustrated in FIG. 1.

Further illustrated in FIG. 1, is a static immobilized patient 108, e.g., back-injured patient, neonate etc., who is statically positioned within room 105 or laying within his/her life supporting environment, incubator etc., and connected via tubes 106 to medical aid 107 (e.g. oxygen, blood infusion). Gantry 101 delivers the maneuverable MRD 103 directly towards this non-moving patient 108 and provides the imaging without disconnecting the patient from his/her medical aid 107; thereby provides the patient with an in situ, real time (in vivo) imaging without mobilizing the patient to a remote location where MRDs usually placed and possibly deteriorating his health condition.

Figure 2:
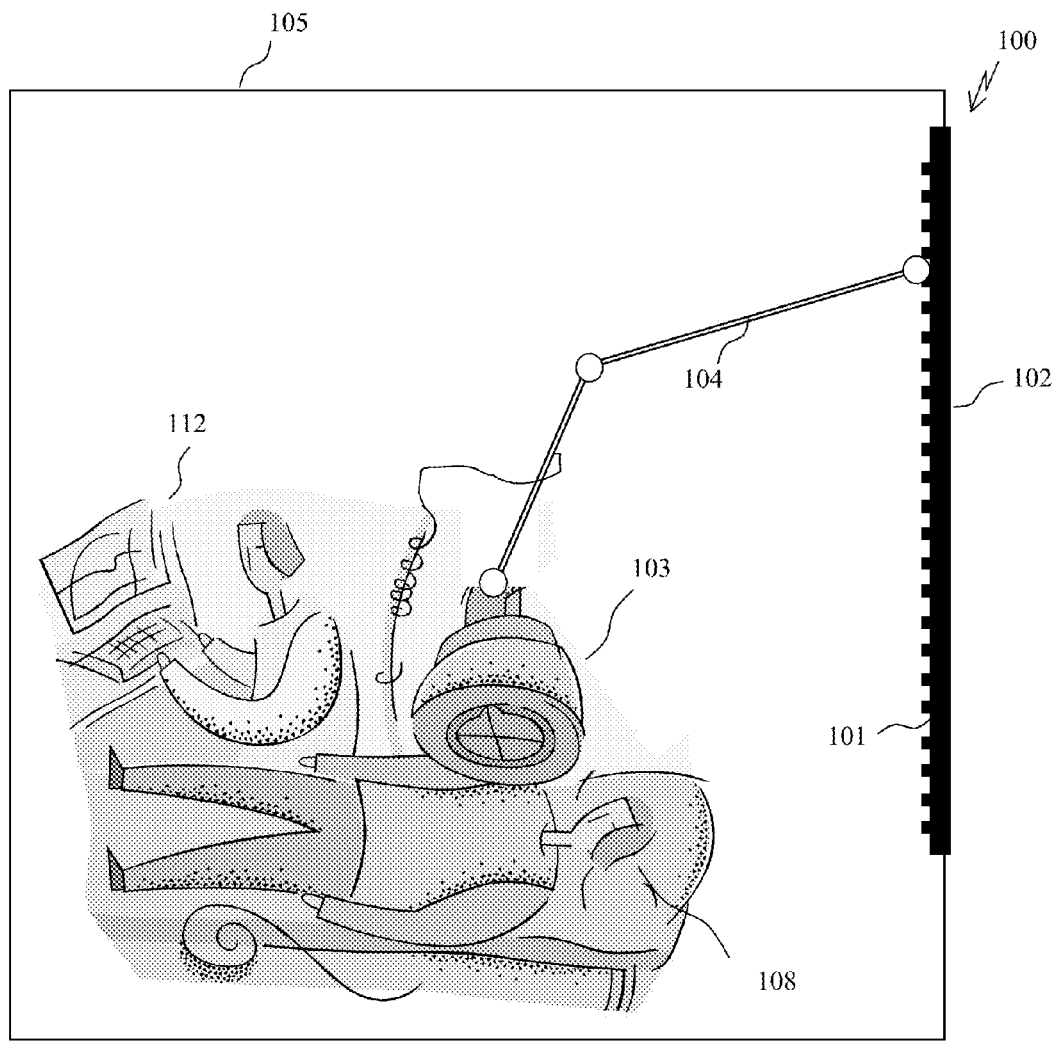
FIG. 2 describes yet another embodiment of the current invention where the system for mobilizing an MRD is constructed on a wall of a patient room.

Reference is now made to FIG. 2, illustrating in a non-limiting manner another embodiment of the current invention presenting MMS 100 which is constructed in a patient's 108 room 105. MMS 100 comprises a gantry 101 (here with 3 joints module 104), attached to the room's 105 structural surface 102, here, a wall. The joints' module 104 is connected to a compact maneuverable MRD 103. The gantry 101 is adapted to move this MRD 103 in N degrees of freedom. Also illustrated in FIG. 2, is a computer station 112 in communication with MRD 103. The computer station instructs the movable MRD for imaging of the static patient 108 without moving the patient 108.

Figure 3:
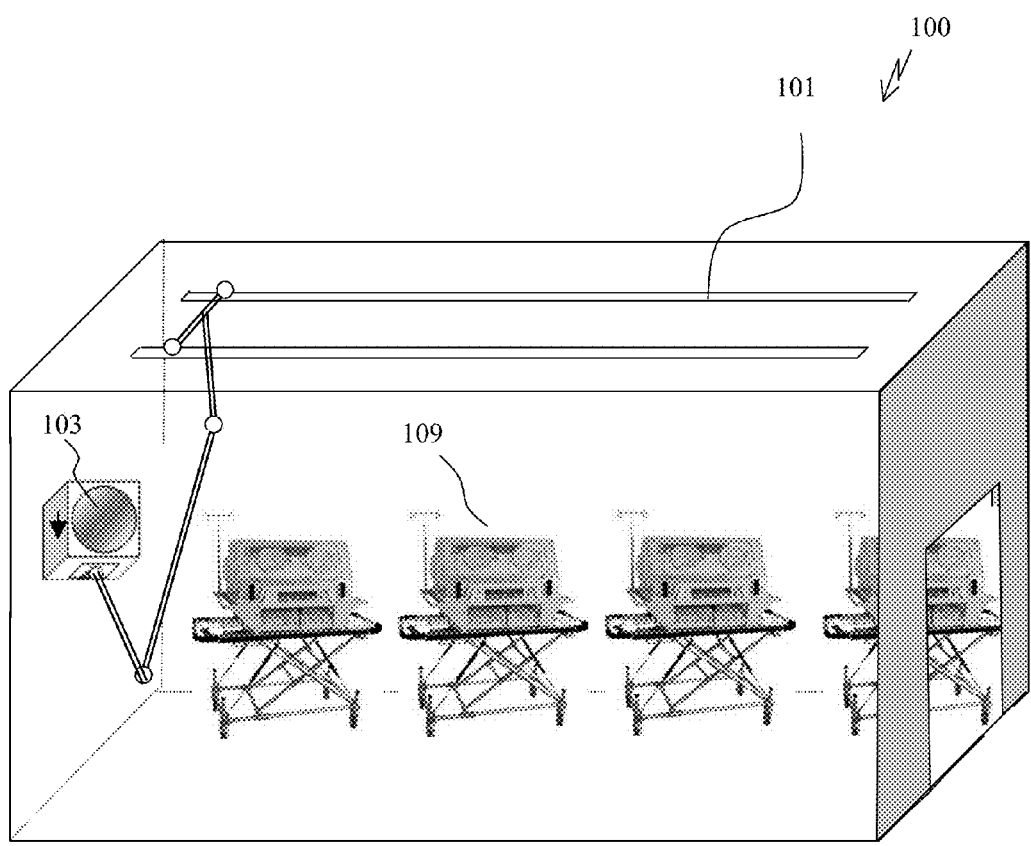
FIG. 3 describes yet another embodiment of the current invention where the system for mobilizing an MRD is constructed on a ceiling of an incubators' room, and where the MRD is set aside.
Figure 4:
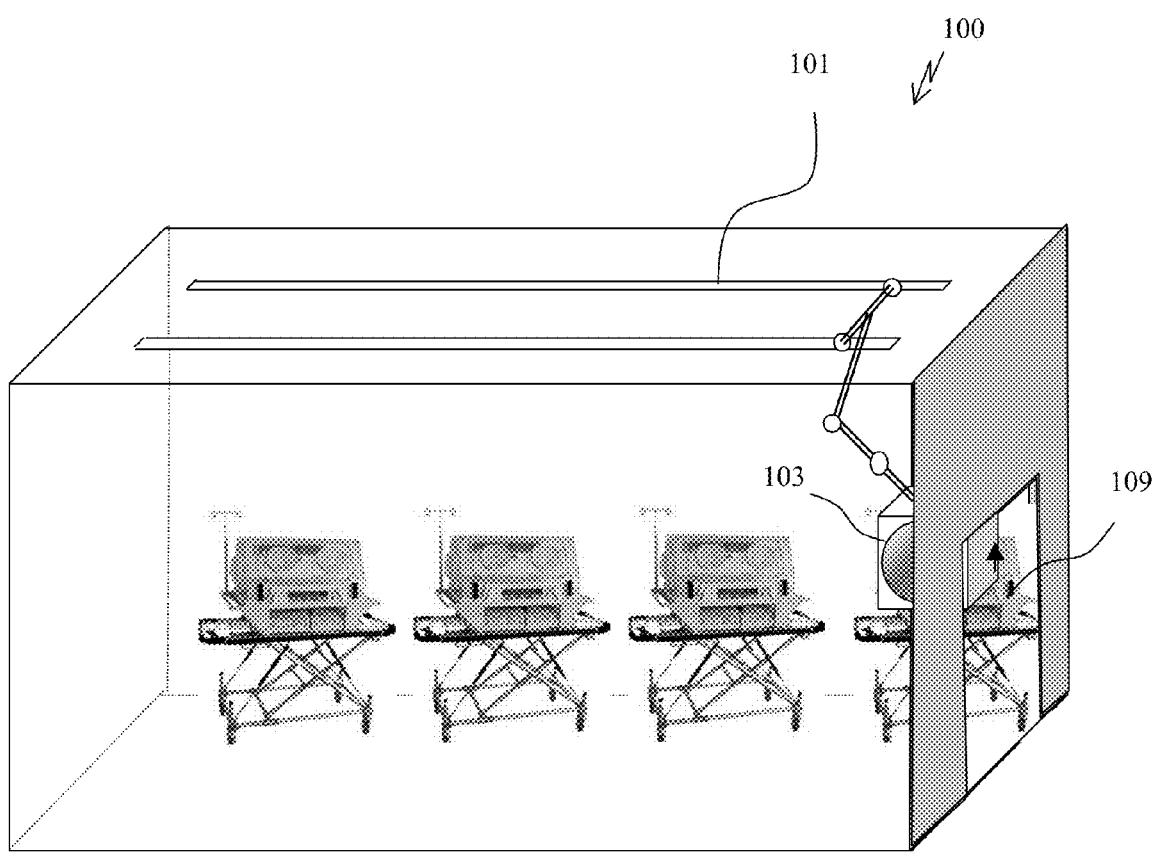
FIG. 4 describes yet another embodiment of the current invention where the system for mobilizing an MRD is constructed on a ceiling of an incubators' room, and where the MRD is in use, above one of the incubators.
Figure 5:
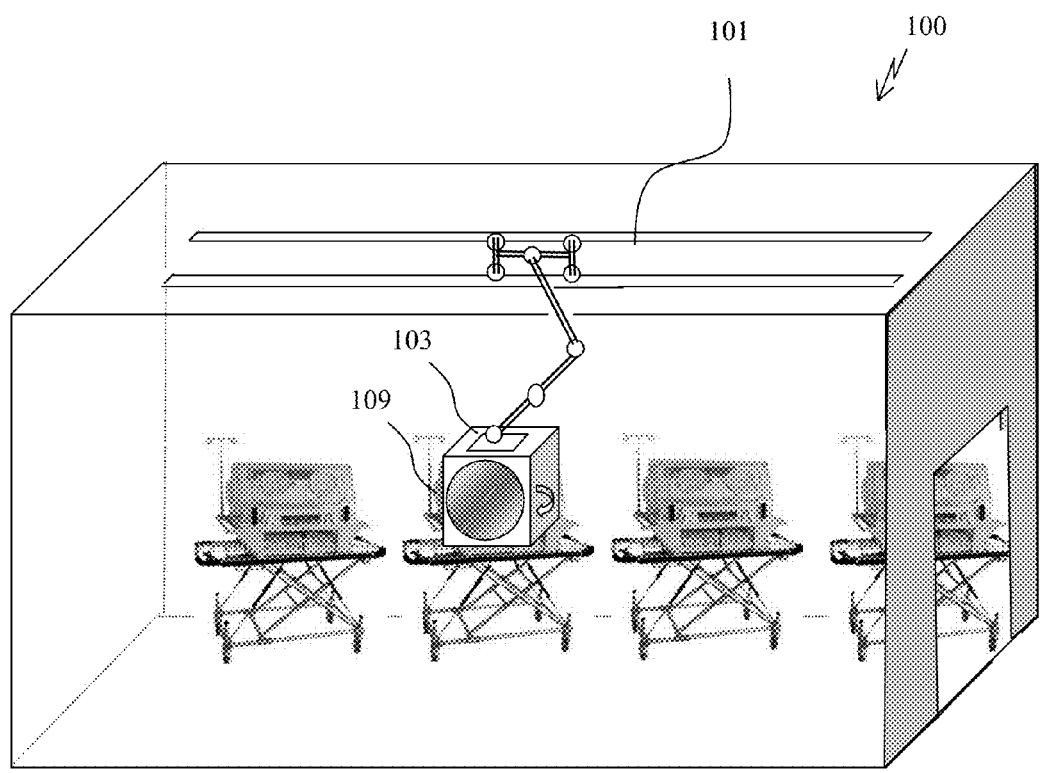
FIG. 5 describes yet another embodiment of the current invention where the system for mobilizing an MRD is constructed on a wall of an incubators' room, and where the MRD is in use, above one of the incubators.

Reference is now made to FIG. 3 illustrating in a non-limiting manner another embodiment of the current invention where MMS (100) is constructed on a ceiling of neonates incubators' room; the neonate-type MRD (103) is set aside between uses. It is noted that the MRD is located here in a first location (up left) and spatially oriented in a first spatial orientation. Reference is now made to FIG. 4, demonstrates MMS (100) in use, above an incubator (109). It is further noted that the MRD is located here in a second remote location (low right) and spatially oriented in a second spatial orientation. Reference is now made to FIG. 5 illustrating in a non-limiting manner another embodiment of the current invention where MMS (100) is constructed on a wall of an incubators' room; the MRD (103) is demonstrated in use, above a neonate's incubator (109). It is further noted that the MRD is located here in a third remote location (middle) and the MRD's open bore's aperture is spatially oriented in a third spatial (i.e., tilted-) orientation towards the neonate.

Figure 6:
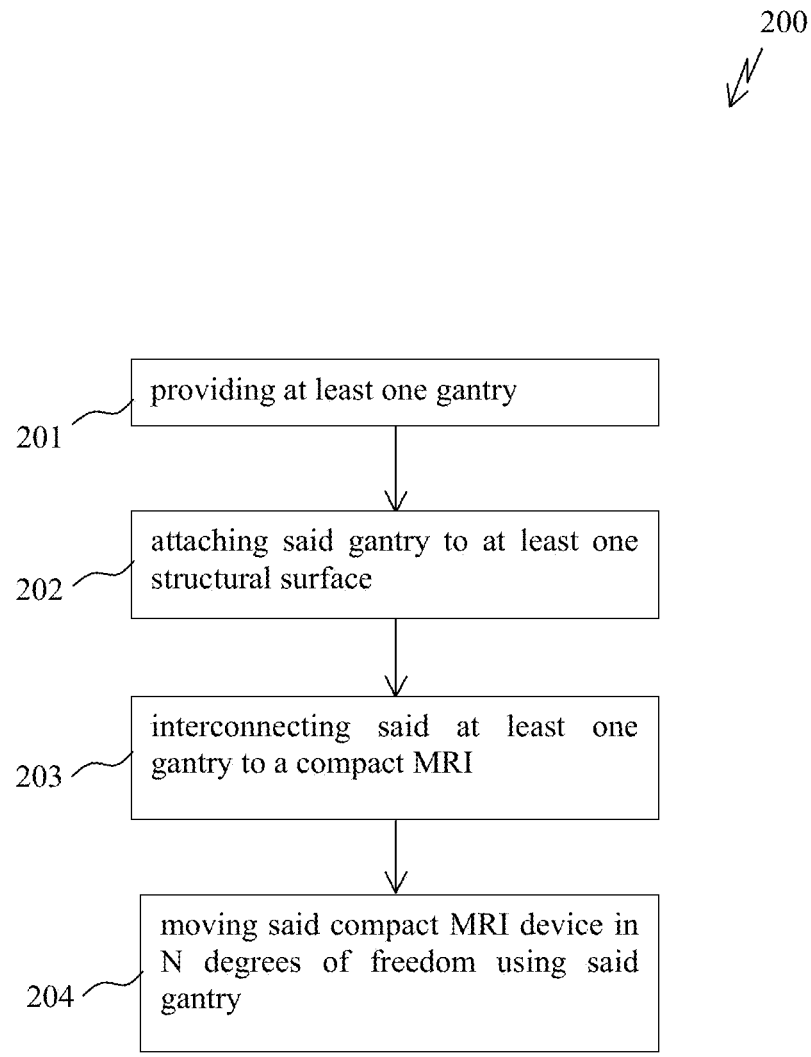
FIG. 6 depicts a flow chart of a method for mobilizing an MRD device.

Reference is now made to FIG. 6, illustrating a flow chart of one method 200 according to the present invention for mobilizing an MRD, the method comprises step 201 of providing at least one gantry; step 202 of attaching the gantry to at least one structural surface; step 203 of interconnecting at least one gantry to a compact MRD. This method additionally comprises a step 204 of moving the compact MRD in N degrees of freedom using the gantry: e.g., moving the MRD (along plain X,Y), elevating the device along the Z axis, and rotating it along said Z axis, to the static, non-mobile patient, and then directing the MRD's open-bore's aperture towards the still immobilized patient, by maneuvering MRD along XY, YZ, and XZ plains, and possibly further rotating or tilting the same (at any θ) along or around any required 2D or 3D axis.

Figure 7:
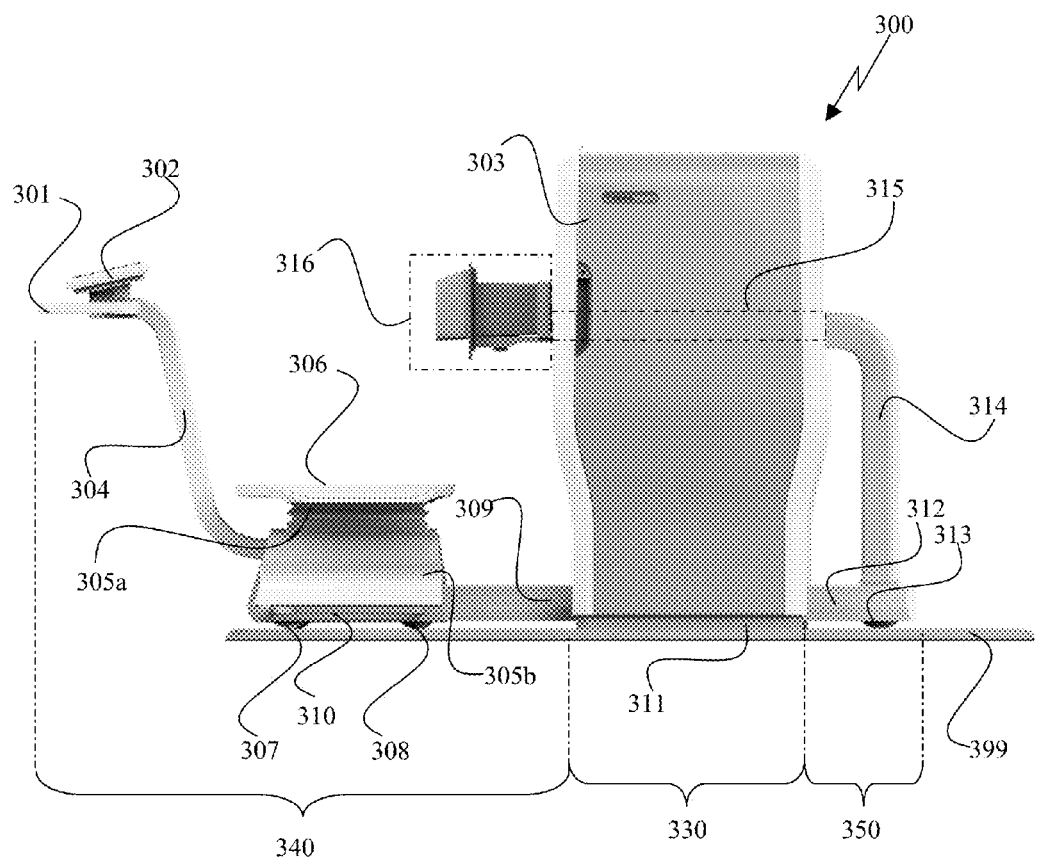
FIG. 7 illustrates a side view of a maneuverable MRD (here, a wrist imaging device) according to an embodiment of the invention.

Reference is now made to FIG. 7, illustrating a side view of a maneuverable MRD system (MMS, 300) comprising a maneuverable MRD (303) here, for example, an open-bore permanent-magnet wrist-type MRI device, commercially available by Aspect Imaging Ltd, US, according to an embodiment of the invention. The MRD is set along a main longitudinal axis (see middle portion 330); and an MRD mobilizing mechanism (herein provided in a non-limiting manner a manual jigger-type gantry) comprising a proximal portion (340), and a distal portion (350), neighboring central MRD's portion 340. MMS (300) comprises inter alia, in its proximal portion 340, patient's accommodating means, such as MMS's handle (301) which is a U-shape member, s leading rod, guiding reed, steering wheel-like member etc. Handle (301) is connected to patient's seat (306) by means of a shaped-neck (e.g., S-shape member 304). MMS' navigation and operation mechanism, MRD operating mechanism, patient's-seat height adjusters, as well as patient's monitors (302) are locatable adjacent to handle 301. Seat's (306) elevation and orientation is definable by means of a seat maneuvering mechanism, which comprises mechanism 305a located within base (305b). Patient's leg acceptors (310) are located aside base 305b. A first set of wheels (307, 308) are affixed, e.g., under the base, on the floor (399). The floor 399 here is a structural surface, and the MRD-connecting gantry is maneuvering the MRD towards the statistic patient's organ over the floor by means of wheels, rail and by means of elevation mechanism 305a etc.

Still along said main longitudinal axis, a set off one or more rails is provided to bare MRD's weight. This MMS's elongated skeleton comprises a proximal portion (309), central portion (311), located under the MRD, and a distal portion (312). A second set of wheels (313) is provided at the distal side of the MMS (350). Construction member 314 is erected and curved to support, either in or adjacent to MRD's open bore (315) wrist accepting assembly (316). It is in the scope of the invention wherein the hereto disclosed floor-gantry comprises one or more maneuverable members, e.g., a joint provided between base (305b) and rail 309. It is also in the scope of the invention wherein the hereto disclosed floor-gantry comprises at least one articulating mechanism, at least one rotation, elongation or bending mechanisms, e.g., a joint provided between base (305b) and rail 309; elevation mechanism of shaft 305a etc.

Figure 8:
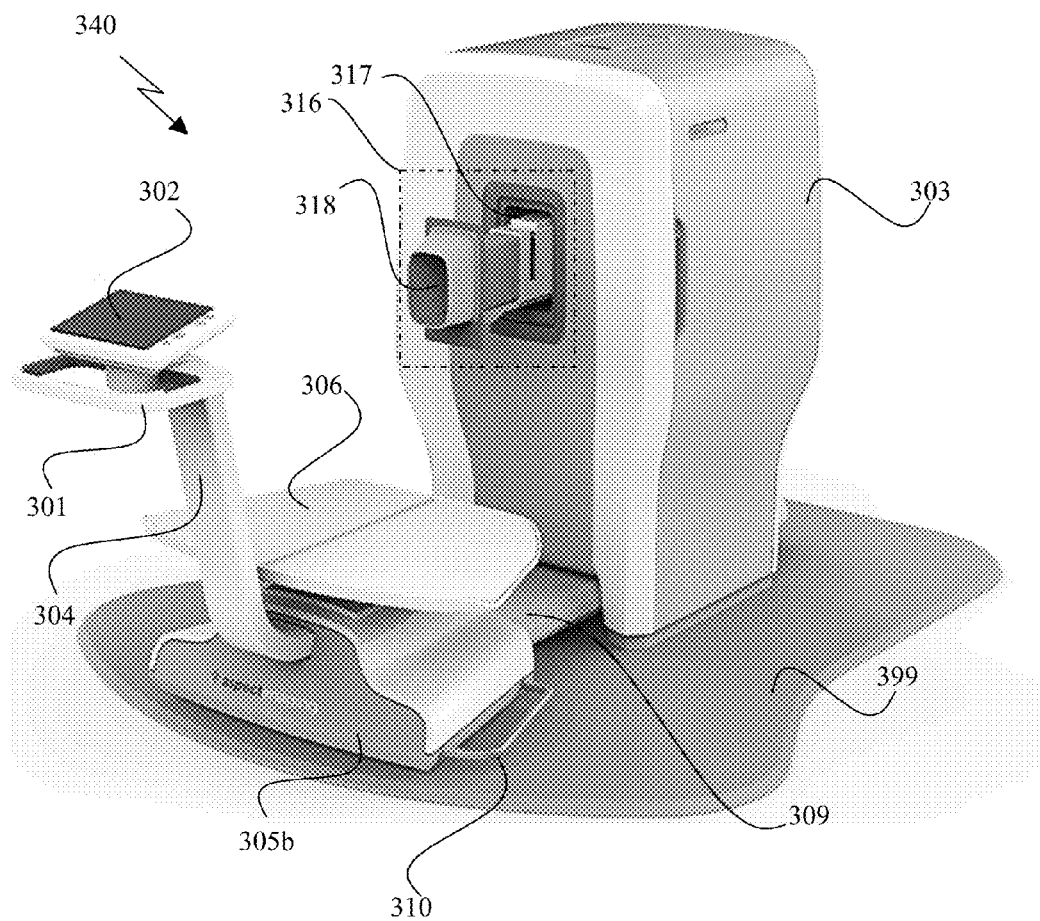
FIG. 8 illustrates a rear and side view of a maneuverable MRD according the said embodiment of the invention.

Reference is now made to FIG. 8, which illustrates a rear and side view of the proximal side (340) of MMS (300) defined above. Here again, along the main longitudinal axis there is located handle (301) and monitors/operators (302), neck (304) interconnected to a seat's base (305b) upon which the patient rest (see seat 306). A pair of legs rest (310) is there provided. MMS's elongated lower skeleton (309, 311 and 312) is carrying an MRD (303), here an open-bore's aperture (318) of a permanent-magnet MRI device comprising a wrist neck (317) provided as an integral member of a wrist accepting assembly (316).

Figure 9:
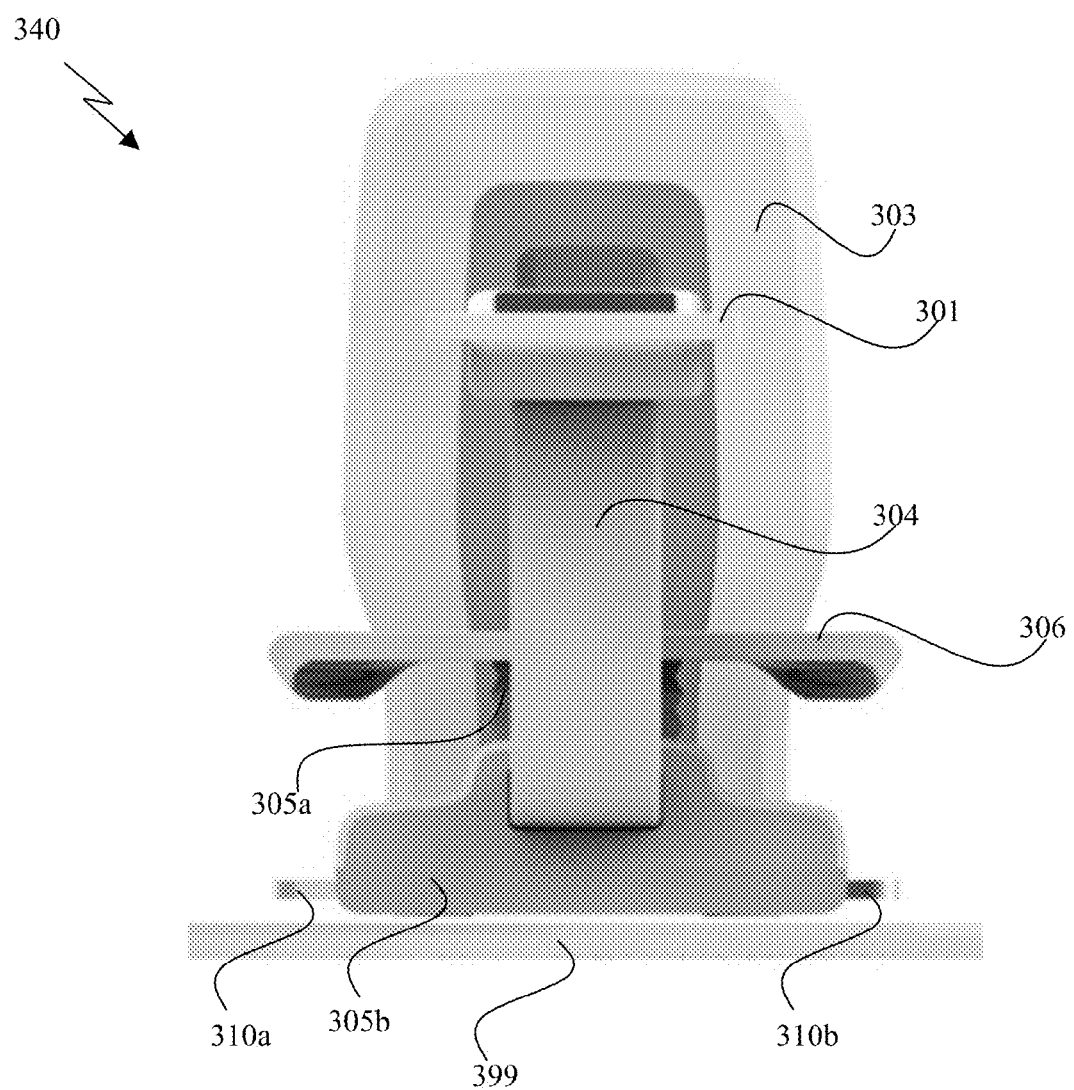
FIG. 9 illustrates a rear view of a maneuverable MRD according the said embodiment of the invention.

Reference is now made to FIG. 9, which illustrates a rear-view of the proximal side (340) of MMS (300) which is defined above. MRD (303) is maneuverable transported by the MMS, comprising, inter alia, in its proximal portion a handle (301), neck (304), connected to a base (305b) which support seat (306) by means of reciprocating (along Z axis) and rotating (around Z axis) mechanism (305a). A pair of legs rests (310a and 310b) is further provided.

It is in the scope of the invention wherein to three different MMSs are provided useful: in a first MMS, the MRD is moving in respect to a non-moving (immobilized static) patient or non-moving patient's organ to be imagined. In a second MMS, the MRD is moving in respect to a moving (non-immobilized) patient or moving (non-immobilized) patient's organ to be imagined. Hence for example, second MMS is applicable in a system where a movable MMS is utilized to scan an organ of a patient (e.g., his/her wrist): the patient is static yet his/her organ is movable. In a third MMS, the MRD's envelope is static yet the organ's accepting assembly of the MRD is movable. Here again, the patient can be either static or mobile.

In an embodiment of the invention, a self-fastening cage (SFC) of an MRD is utilized in an MMS as defined above. This SFC-MRD is characterized by an outside shell, which comprises at least three flexi-jointed superimposed walls disposed in a predetermined clockwise or counterclockwise arrangement. The MRD comprises at least six side-magnets arranged in two equal groups being in a face-to-face orientation in a magnetic connection with the outside shell, increasing the overall strength of the magnetic field provided in the cage; at least two pole-magnet pieces, arranged in a face-to-face orientation in between the side-magnets; and, at least two main-magnets, located on the pole-pieces, arranged in a face-to-face orientation, generating the static magnetic field therein the cage. As an example, at least a portion of the side-magnets are superconductors or ferromagnets. A commercially available selected from the M-series product of Aspect Imaging Ltd (US) is an example of such an SFC-MRD.

In some embodiments of the current invention, the degrees of freedom as defined above, which the gantry enables may be selected from a group consisting for example of: horizontal (X axis and Y axis), vertical (Z axis), longitudinal, altitudinal, angular, and a combination thereof.

In some embodiments of the current invention, movement of the compact MRD as defined above, is provided in a manual manner, automatic mechanism, computerized mechanism, and any combination thereof.

In some embodiments of the current invention, the structural surface as defined above may be selected from a group consisting of: floor, ceiling, wall, any constructed surface, and any combination thereof.

In some embodiments of the current invention, compact MRD as defined above, is interconnected to at least one gantry by a module constructed of N joints. In other embodiments, a maneuverable member may be constructed as part of the gantry. In yet another embodiment, the gantry may be modular, enabling the removal of certain parts upon request.

In some embodiments of the current invention, the gantry as defined above, may be located in a room selected from a group consisting for example of: hospital room, premature special care unit, intensive care unit, neonatal unit, any space in which lies a disable patient, immobilized objet, and a combination thereof.

In some embodiments of the current invention, compact MRD as defined above, is in communication with a working station adapted to operate the compact MRD.

Example 1

In one example of the current invention, a premature is in an incubator in a newborn intensive care unit. The premature neonates needs an MRD scanning, however, moving them to an MRD located in a different room, and usually to a different department in different floor is very dangerous.

Thus, in the newborn intensive care unit, an MMS for maneuvering a neonate's-type MRD is provided. The MMS comprises a gantry which comprises a transporting mechanism and, a neonate's-type MRD, interconnected to the gantry by at least one maneuverable member. The MRD, by means of the gantry, is transportable from a first location to or adjacent a static neonate located at a second remote location, where neonate's incubator is placed. The aperture of the neonate's-type MRD's open-bore, by means of the maneuverable member, is directable towards a defined spatially orientation facing the neonate or incubator thereof. Thus, the premature neonate is not mobilized nor transferred from his safe environment to a remote dangerous location where MRD usually maintained and operated.

The imaging of this premature neonate in his incubator is provided useful by a method of maneuvering a portable open-bore neonate's-type magnetic resonance device with no fringing of its magnetic field (neonate's-type MRD) from at least one first location towards at least one static neonate placed in an incubator at least one second remote location by means of a neonate's-type MRD maneuvering system (MMS). The method comprises inter alia steps as follows; providing an MMS with in a room; interconnecting the MMS to a gantry having inter alia a transporting mechanism; interconnecting an open-bore neonate's-type MRD to the gantry by at least one maneuverable member; transporting the neonate's-type MRD, by means of the gantry, from the first location to the second remote location adjacent to a neonate or incubator thereof; and directing the aperture of the neonate's-type MRD's open-bore, by means of the maneuverable member, towards a defined spatial orientation facing the neonate or an incubator thereof.

It is acknowledged in this respect that a method of mobilizing a maneuverable open-bore MRD from a first location to a second remote location to a static trauma patient or organs thereof is further useful. This method is characterized by the following steps: providing in the intensive care unit at least one first location and at least one second remote location, namely the patient bad and medical facilities, life supporting systems, and tubing thereof; constructing a structural surface in at least one portion of the intensive care unit; temporarily or permanently interconnecting the gantry to the surface by means of a transporting mechanism; temporarily or permanently interconnecting the gantry to an MRD by means of at least one maneuverable member; transporting the MRD, by means of the transporting mechanism, from the at least one first location to the at least one second remote location; and at the at least one second location, spatially orienting the open-bore's aperture of the MRD, by means of the maneuverable member, towards the trauma patients or organs thereof; thereby imaging this immobilized trauma patient or organ thereof in vivo and in situ by means of this maneuverable MRD.

Example 2

In another example of the current invention, after a trauma caused by a serious car accident, a patient in coma is medically treated in an intensive care unit. MRI is required, nevertheless, he is respirated, and is connected to a plurality of life supporting systems and pings thereof; therefore he cannot be moved from his bed.

Hence, by a means of a gantry of the present invention, which is provided useful for maneuvering a portable open-bore magnetic resonance device with no fringing of its magnetic field (MRD) from at least one first location towards at least one static patient placed at least one second remote location? Here, the remote location is the trauma quarters in the intensive care unit. The gantry comprises a transporting mechanism; and, an open-bore MRD, interconnected to the gantry by at least one maneuverable member. The MRD, by means of the gantry, is transportable from the first location to the second remote location adjacent the static patient. The aperture of the MRD's open-bore, by means of the maneuverable member, is directable towards a defined spatial orientation facing the static patient.

The imaging of this trauma patient is provided useful by a method of maneuvering a portable open-bore magnetic resonance device with no fringing of its magnetic field (MRD) from at least one first location towards at least one static patient placed at at least one second remote location by means of a gantry. The method comprises, inter alia, steps as follows: providing the gantry with a transporting mechanism; interconnecting an open-bore MRD to the gantry by at least one maneuverable member; transporting the MRD, by means of the gantry, from the first location to the second remote location adjacent the static patient; and directing the aperture of the MRD's open-bore, by means of the maneuverable member, towards a defined spatial orientation facing the static trauma patient.

Example 3

In another example of the current invention, in an orthopedic clinic, (i) a wrist-type MRD is maneuverable in respect to a sitting (non-moving) patient with a broken hand to be analyzed; (ii) a wrist-type MRD is maneuverable in respect to a sitting (yet moving) patient with a broken hand to be analyzed. In the first case, the MRD of the open-bore portion of the same is maneuverable in respect to the wrist to be imagined.

For this purpose, an MMS for maneuvering a wrist-type MRD is provided. The MMS comprises inter alia: a gantry which further comprises a transporting mechanism; and, a wrist-type MRD, interconnected to the gantry by at least one maneuverable member; wherein the MRD, by means of the gantry, is transportable from a first location to a second remote location; and further wherein the aperture of the MRD's open-bore, by means of the maneuverable member, is directable towards a defined spatial orientation facing the wrist of a patient.

The imaging of this wrist is provided useful by a method of maneuvering a portable open-bore wrist-type magnetic resonance device with no fringing of its magnetic field (wrist-type MRD) from at least one first location towards at least one static patient placed at least one second remote location by means of a wrist-type MRD maneuvering system (MMS). This method comprising steps of providing the MMS with in a room; interconnecting the MMS to a gantry having inter alia a transporting mechanism; interconnecting an open-bore wrist-type MRD to the gantry by at least one maneuverable member; transporting the wrist-type MRD, by means of the gantry, from the first location to the second remote location adjacent to the static patient and directing the aperture of the wrist-type MRD's open-bore, by means of the maneuverable member, towards a defined spatial orientation facing the patient's wrist.

The invention claimed is:

1. A system comprising:
   a portable open-bore magnetic resonance device (MRD) with substantially no fringing of its magnetic field in which the open bore comprises an aperture;
   a gantry for maneuvering said MRD a from at least one first location towards at least one second remote location in which a static patient is placeable, said gantry comprising a transporting mechanism having a longitudinal axis and comprising a proximal portion and a distal portion, said distal portion being at said second location;
   a seat at said second location;
   an open-bore MRD being interconnected to said gantry by at least one maneuverable member; wherein said MRD, by means of said gantry, is transportable from said first location to said second remote location,
   the aperture of said MRD's open-bore, by means of said maneuverable member, being directable towards a defined spatially orientation with respect to said second location, and said system further comprising a handle at the proximal portion connected to the seat, and MRD operating mechanism, seat height adjusters and patient monitors located adjacent to said handle.

2. The system according to claim 1, wherein said open-bore MRD is a wrist-type MRD.

3. The system according to claim 2, wherein the aperture, by means of said maneuverable member, is directable towards a defined spatial orientation facing the wrist of a patient.

4. The system according to claim 3, comprising a wrist neck provided as an integral member of a wrist accepting assembly at the open bore aperture.

5. The system according to claim 1, wherein said maneuverable member is selected from a group consisting of an articulated joint, a flexible joint, a rotatable joint, internally compensated self-aligning rotary joint, a ball joint, ball and socket joint, elbow constructed joint, hydraulic joint mechanism, telescopic joint, clampers, gimbals and claspers thereof and any combination thereof.

6. The system according to claim 1 comprising a set of wheels affixed on the floor for maneuvering the MRD towards a statistic patient's organ.

7. The system according to claim 1 wherein the gantry further comprises a set of rails to bear the weight of the magnetic resonance device.

* * * * *